US008367455B2

(12) United States Patent
Hu et al.

(10) Patent No.: US 8,367,455 B2
(45) Date of Patent: Feb. 5, 2013

(54) IMAGE SENSOR AND RELATED FABRICATING METHOD THEREOF

(75) Inventors: Yu-Ping Hu, Grand Cayman (KY); Chih-Wei Hsiung, Grand Cayman (KY); Fang-Ming Huang, Grand Cayman (KY); Chia-Chi Huang, Grand Cayman (KY); Chung-Wei Chang, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 299 days.

(21) Appl. No.: 12/790,847

(22) Filed: May 30, 2010

(65) Prior Publication Data

US 2011/0291211 A1 Dec. 1, 2011

(51) Int. Cl.
  *H01L 21/00* (2006.01)
  *H01L 31/0232* (2006.01)
  *H01L 27/14* (2006.01)

(52) U.S. Cl. ............. 438/69; 438/57; 438/70; 257/431; 257/432; 257/460

(58) Field of Classification Search .............. 257/432, 257/431, 460, E27.13; 438/57, 69, 70
See application file for complete search history.

(56) References Cited

U.S. PATENT DOCUMENTS

| 2007/0040102 A1* | 2/2007 | Mouli ................ 250/214.1 |
| 2008/0150054 A1* | 6/2008 | Kim ..................... 257/432 |
| 2009/0200624 A1* | 8/2009 | Dai et al. .............. 257/432 |
| 2009/0224348 A1* | 9/2009 | Matsushita ............ 257/432 |

* cited by examiner

*Primary Examiner* — Michael Lebentritt
*Assistant Examiner* — Aaron Dehne
(74) *Attorney, Agent, or Firm* — Winston Hsu; Scott Margo

(57) ABSTRACT

A fabricating method of an image sensor includes the steps of: providing a substrate; forming sensing elements on the substrate; forming microlenses on the sensing elements; filling a stuffed material on the microlenses, and air regions are formed in the stuffed material; and forming optical filters on the stuffed material.

12 Claims, 6 Drawing Sheets

IMAGE SENSOR AND RELATED FABRICATING METHOD THEREOF

BACKGROUND OF THE INVENTION

1. Field of the Invention

The present invention relates to an image sensor, and more particularly, to an image sensor and related fabricating method thereof.

2. Description of the Prior Art

Digital cameras are electronic products being widely used nowadays, and image sensors are disposed in the digital cameras for converting lights into electric charges. Generally speaking, the conventional image sensors can be divided into two categories. One includes charge-coupled device (CCD) image sensors, and the other includes CMOS image sensors, wherein the CMOS image sensor is manufactured by using CMOS technology.

The CMOS image sensor can be manufactured by combining with its necessary peripheral circuits since it is manufactured by adopting a conventional CMOS circuit process, such that the manufacturing cost of the CMOS image sensor is much lower than that of the CCD image sensor. Except for the lower manufacturing cost, the CMOS image sensor also has advantages of a small size and low power consumption.

FIG. 1 is a diagram of a conventional CMOS image sensor 100 according to the prior art. In FIG. 1, the CMOS image sensor 100 includes a substrate 110 and a plurality of pixels within the substrate 110. Each pixel includes a sensing element 160, an optical filter 120, and a microlens 130. The microlens 130 is used for gathering an incident light 150. The optical filter 120 is disposed between the substrate 110 and the microlens 130, and utilized for filtering the incident light 150. As can be seen from FIG. 1, the incident light 150 needs to pass through the microlens 130 and the optical filter 120 to reach the sensing element 160. That is to say, the architecture of the conventional CMOS image sensor 100 will result in a loss of the incident light 150 before the incident light 150 finally arrives at sensing element 160. Additionally, the conventional CMOS image sensor 100 also has to enhance quantum efficiency and reduce cross-talk.

Hence, how to improve the performance of the CMOS image sensor and solve the abovementioned problem has become an important topic for designers in the field.

SUMMARY OF THE INVENTION

It is one of the objectives of the claimed invention to provide a fabricating method of an image sensor and a related image sensor, to solve the abovementioned problems.

According to one aspect of the present invention, an exemplary fabricating method of an image sensor is provided. The exemplary fabricating method includes the steps of: providing a substrate; forming sensing elements on the substrate; forming microlenses on the sensing elements; filling a stuffed material on the microlenses, and air regions are formed in the stuffed material; and forming optical filters on the stuffed material.

In one embodiment, the stuffed material is filled on the microlenses by utilizing a chemical vapor deposition process.

According to another aspect of the present invention, an exemplary image sensor is provided. The exemplary image sensor includes a substrate, a sensing element, an optical filter, a microlens, and a stuffed material. The sensing element is formed on the substrate. The microlens is formed on the sensing element. The stuffed material is filled on the microlens, wherein at least one air region is formed in the stuffed material. The optical filter is formed on the stuffed material.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but not in function. In the following discussion and in the claims, the terms "include", "including", "comprise", and "comprising" are used in an open-ended fashion, and thus should be interpreted to mean "including, but not limited to . . . ". The terms "couple" and "coupled" are intended to mean either an indirect or a direct electrical connection. Thus, if a first device couples to a second device, that connection may be through a direct electrical connection, or through an indirect electrical connection via other devices and connections.

Figure 2:
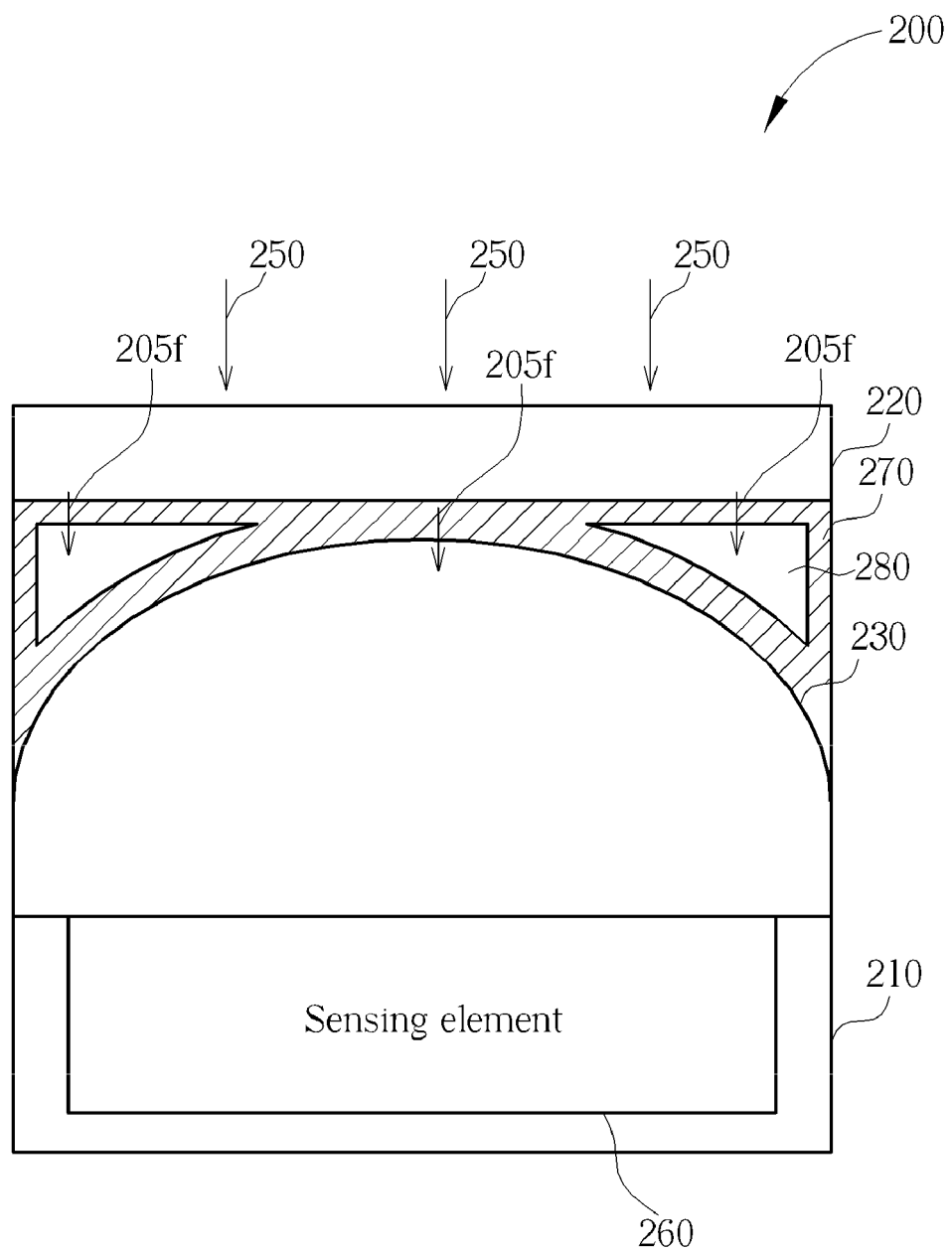
FIG. 2 is a diagram showing an image sensor according to a first embodiment of the present invention.

FIG. 2 is a diagram showing an image sensor 200 according to a first embodiment of the present invention. As shown in FIG. 2, the image sensor 200 includes, but is not limited to, a substrate 210, and plural pixels formed within the substrate 210. Each pixel includes a sensing element 260, an optical filter 220, a microlens 230, and a stuffed material 270. The optical filter 220 is used for filtering an incident light 250 to generate a filtered incident light 250$f$. The microlens 230 is formed on the sensing element 260 and is disposed between the substrate 210 and the optical filter 220, and used for gathering the filtered incident light 250$f$ into the sensing element 260. What calls for special attention is that the stuffed material 270 is filled on the microlens 230, that is to say, the stuffed material 270 is formed upon the microlens 230 as a planar layer, for the optical filter 220 to be formed thereon. At least one air region 280 is formed in the stuffed material 270 for providing the filtered incident light 250$f$ with a refraction path.

Please note that, one advantage of the image sensor 200 disclosed in the embodiment is to shorten the optical path of the filtered incident light 250$f$ reaching the sensing element 260, since the microlens 230 is disposed between the substrate 210 and the optical filter 220. Therefore, quantum efficiency (QE) can be improved due to a better light transmission efficiency provided by the proposed architecture. In addition, compared with the conventional CMOS image sensor 100 shown in FIG. 1, another advantage of the image sensor 200 is that the height of the optical filter 220 can be lowered since the optical filter 220 is above the microlens 230. As a result, the manufacturing cost can be reduced.

In one embodiment, the stuffed material 270 may be filled on the microlenses by deposition, sputtering or other process, but this in no way should be considered as limitations of the present invention. The air region 280 is formed as a result of the filling process of the stuffed material 270. By adjusting at least the processing speed of the stuffed material 270, the characteristics of the air region 280 can be determined, such as the size or the shape. Moreover, in order to make the filtered incident light 250f get into the microlens 230 more effectively, a refraction index of the stuffed material 270 may be selected to be different from the refraction indexes of the optical filter 220 and the microlens 230. Yet another advantage of the present embodiment is to improve the light gathering (guiding) performance of the microlens 230 when the refraction index of the stuffed material is designed to be in between the refraction index of the optical filter 220 and the refraction index of the microlens 230.

In addition, since the air has a refraction index equaling to "1", and thus the air region 280 formed in the stuffed material 270 can provide the filtered incident light 250f with a better refraction path. Certainly, people skilled in the art will readily appreciate that other manufacturing processes for forming the stuffed material 270 and the air region(s) 280 are feasible without departing from the spirit of the present invention.

Figure 3:
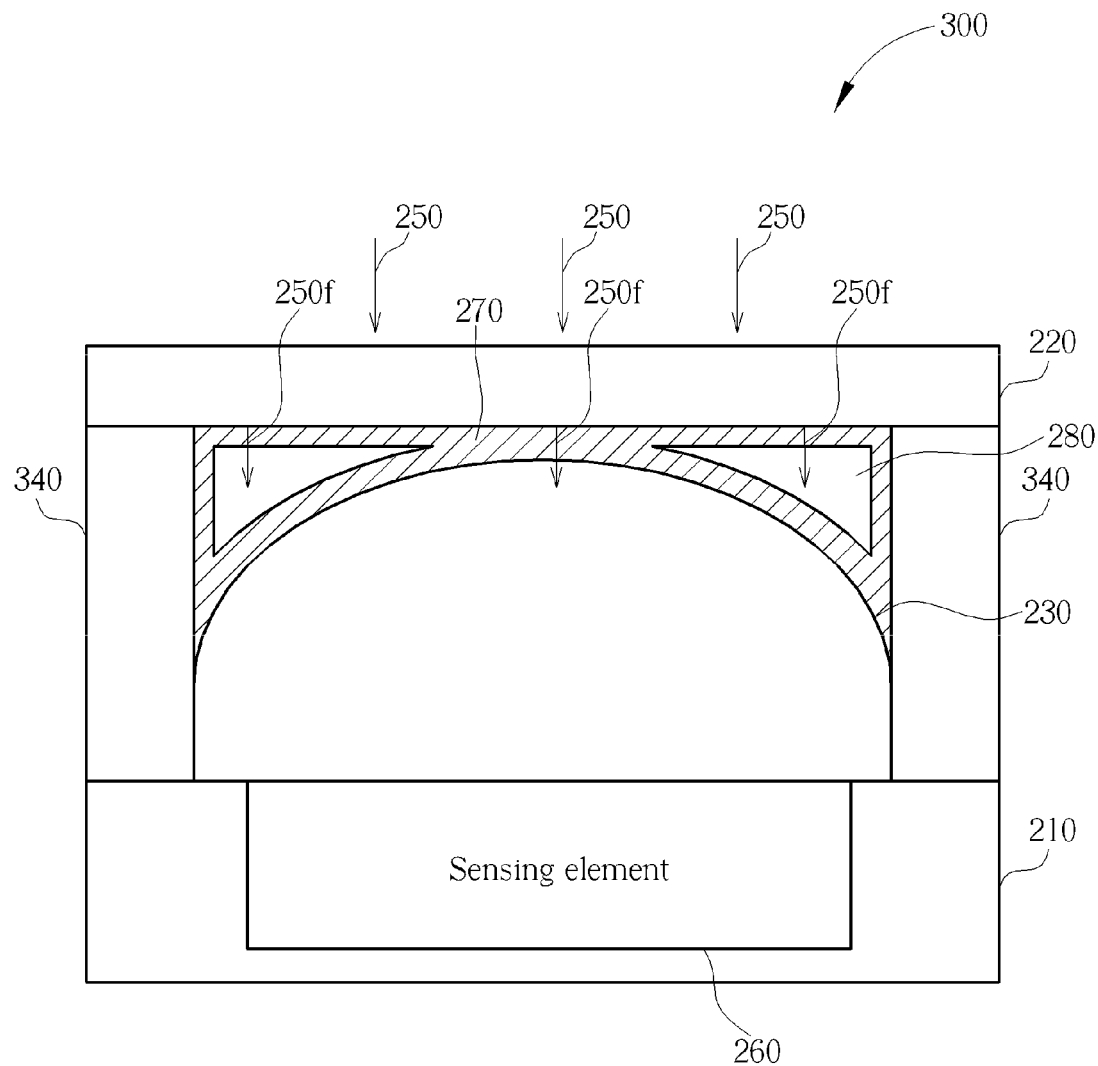
FIG. 3 is a diagram showing an image sensor according to a second embodiment of the present invention.

FIG. 3 is a diagram showing an image sensor 300 according to a second embodiment of the present invention. As shown in FIG. 3, the image sensor 300 includes, but is not limited to, a substrate 210, and a plurality of pixels. Each pixel includes a sensing element 260, an optical filter 220, a microlens 230, a stuffed material 270, an air region 280, and a shelter 340. Since detailed operations of the substrate 210, the sensing element 260, the optical filter 220, the microlens 230, the stuffed material 270, and the air region 280 of the image sensor 300 are the same as that of the image sensor 200, therefore, additional description is omitted here for brevity. The difference between them is that the image sensor 300 further includes the shelter 340 disposed around the microlens 230, for preventing the sensing element 260 from being affected by a stray light, and for reflecting the incident light 250 of the shelter 340 into the microlens 230.

Please note that in one embodiment, the shelter 340 may be made of a reflective material, such as metal. But this should not be considered as a limitation of the present invention, and other materials that are capable of achieving the same objective may be adopted for implementing the shelter 340. Furthermore, in order to prevent the microlens 230 from being affected by a stray light more effectively, a height of the shelter 340 may be properly designed to be not less that a height of the microlens 230, but this is for illustrative purposes only.

Figure 1:
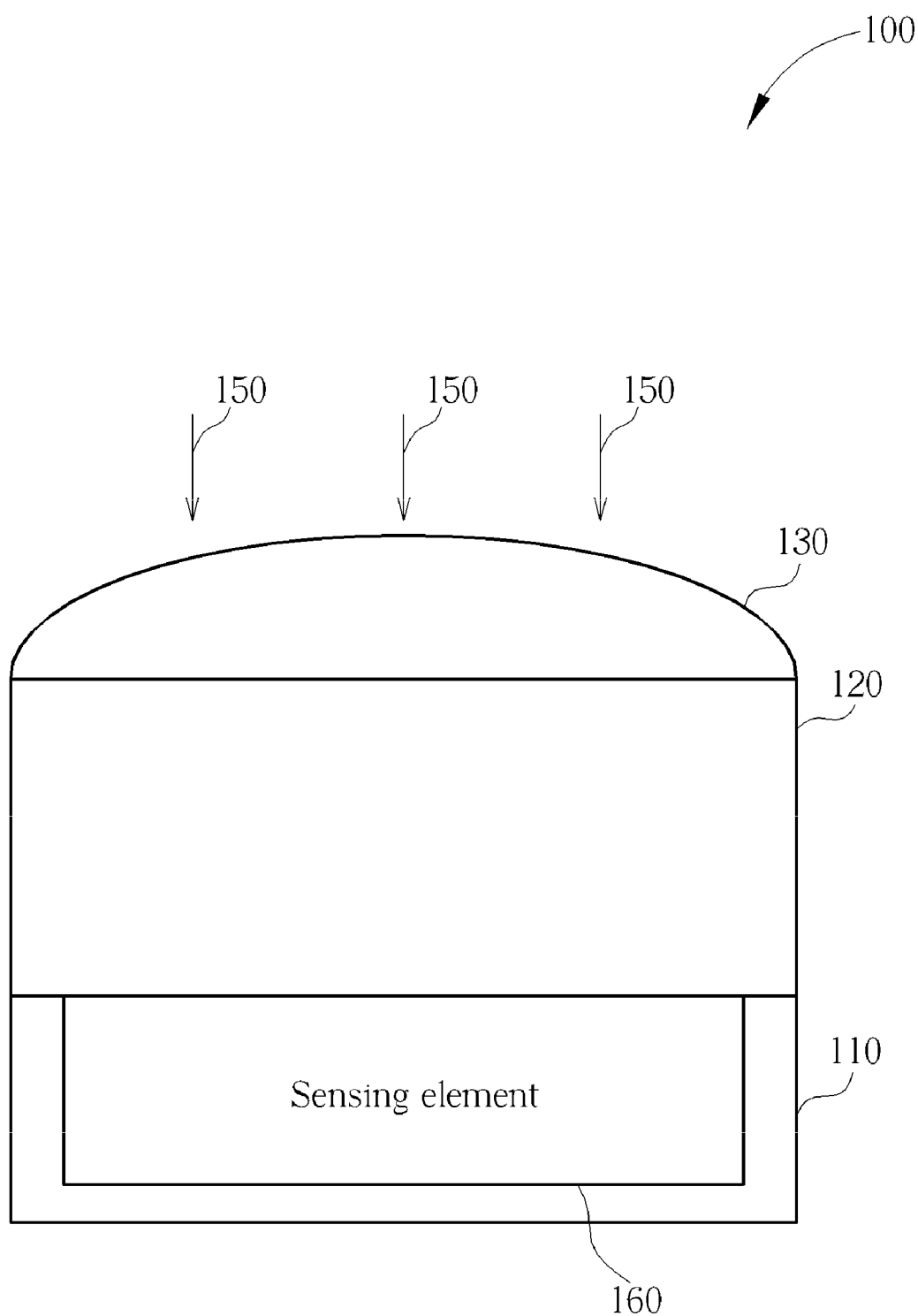
FIG. 1 is a diagram of a conventional CMOS image sensor according to the prior art.

As one can see from FIG. 3 and FIG. 1, compared with the conventional CMOS image sensor 100 shown in FIG. 1, another advantage of the image sensor 300 is that the shelter 340 adopted in the image sensor 300 has a height to reduce cross-talk between adjacent pixels.

Figure 4:
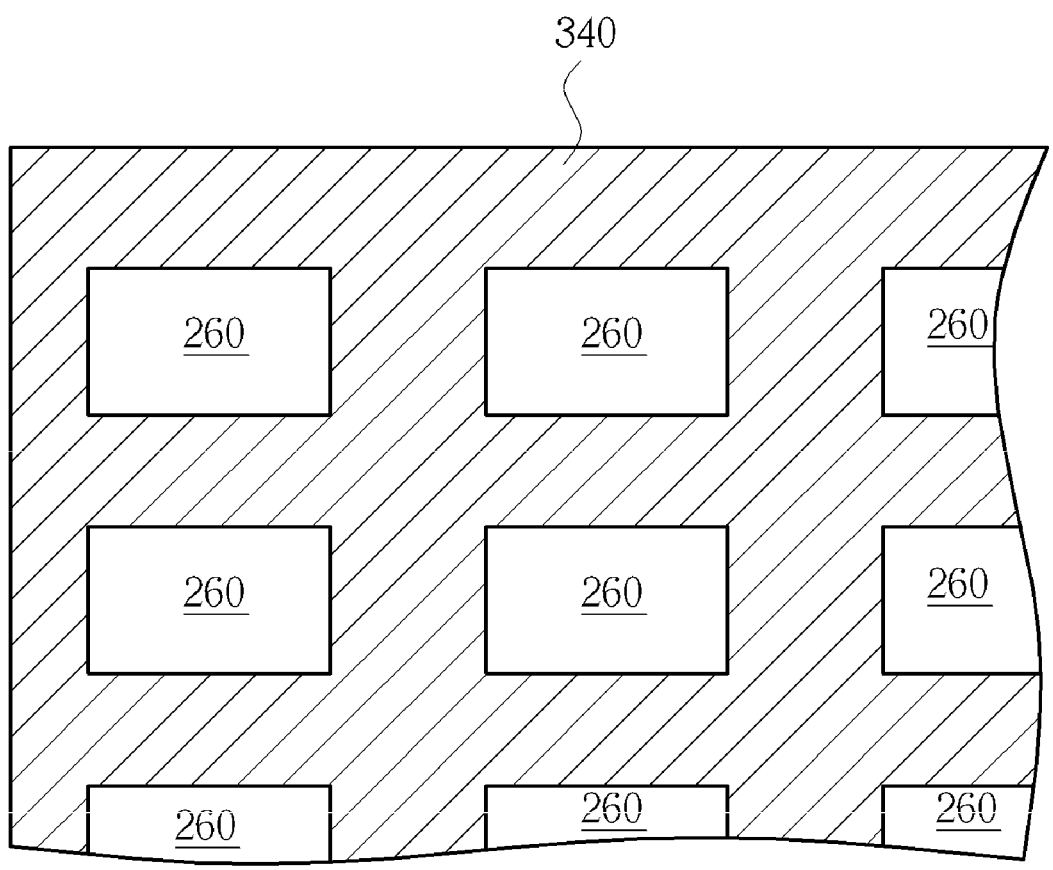
FIG. 4 is a top view of a plurality of image sensors respectively corresponding to a plurality of pixels.

First, in order to make the structure of the shelter 340 easy to understand, a brief description of the shelter 340 is given as below. Please refer to FIG. 4. FIG. 4 is a top view of the image sensor 300. As FIG. 4 depicts, the shelter 340 is placed around the sensing elements 260, and is capable of reducing the cross-talk between adjacent pixels. Since a skilled person can readily understand features of the shelter 340 after reading above paragraphs, further description is omitted here for brevity.

Figure 5:
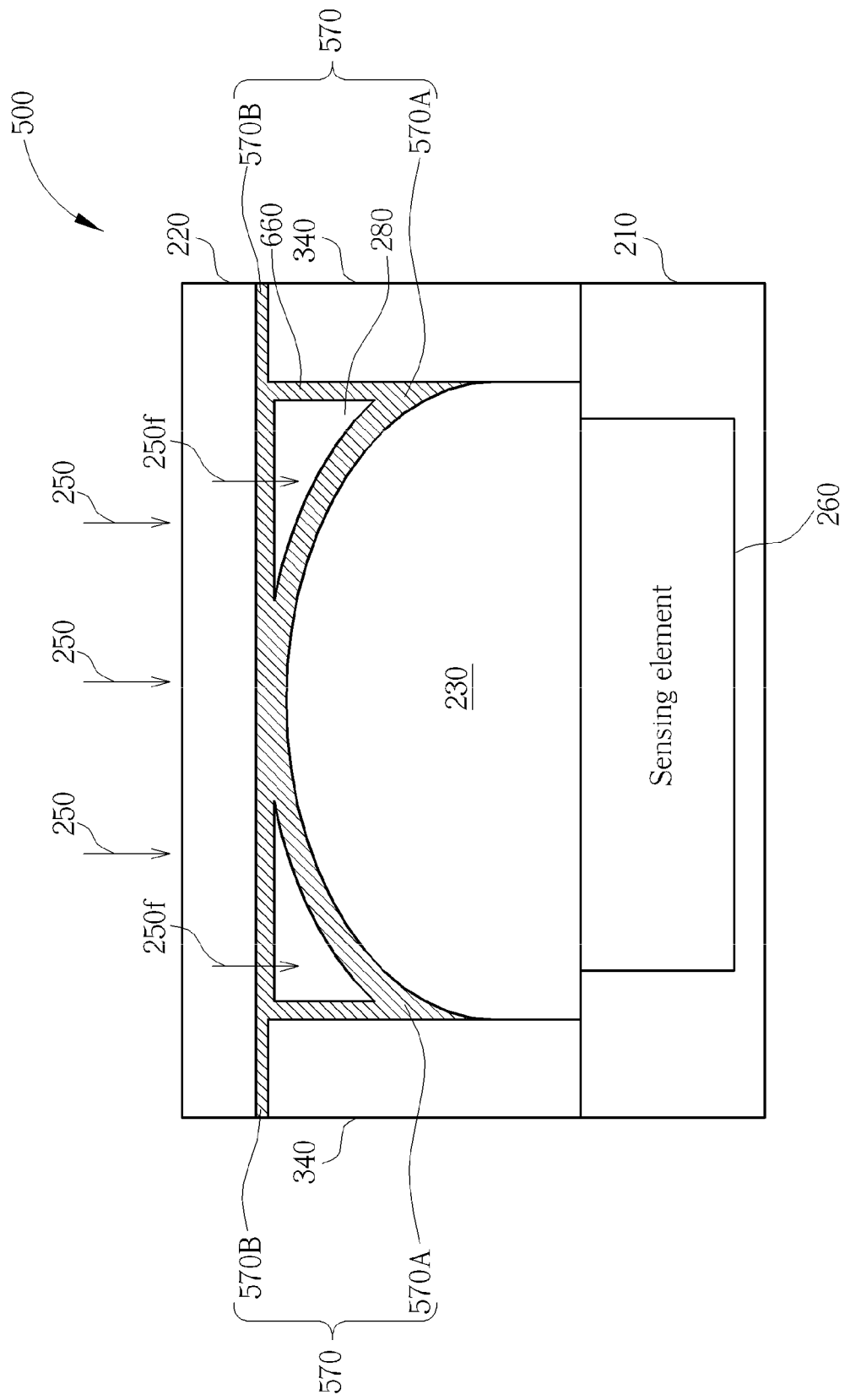
FIG. 5 is a diagram showing an image sensor according to a third embodiment of the present invention.

FIG. 5 is a diagram showing an image sensor 500 according to a third embodiment of the present invention. The architecture of the image sensor 500 is similar to that of the image sensor 300 shown in FIG. 3, and the difference between them is that a stuffed material 570 (including a first part 570A and a second part 570B) of the image sensor 500 is further filled in between the optical filter 220 and the shelter 340. In other words, in this embodiment, the stuffed material 570 is filled in both the space in between the optical filter 220 and the microlens 230 (i.e., the first part 570A) as well as the space in between the optical filter 220 and the shelter 340 (i.e., the second part 570B).

Please note that in the embodiments mentioned above, the image sensor 200/300/500 disclosed in the present invention may be implemented by a Complementary Metal Oxide semiconductor (CMOS) sensor. Moreover, the image sensor 200/300/500 can employ a back side illumination (BSI) technology or front side illumination technology. However, this is for illustrative purposes only, and is not meant to be a limitation of the present invention.

Figure 6:
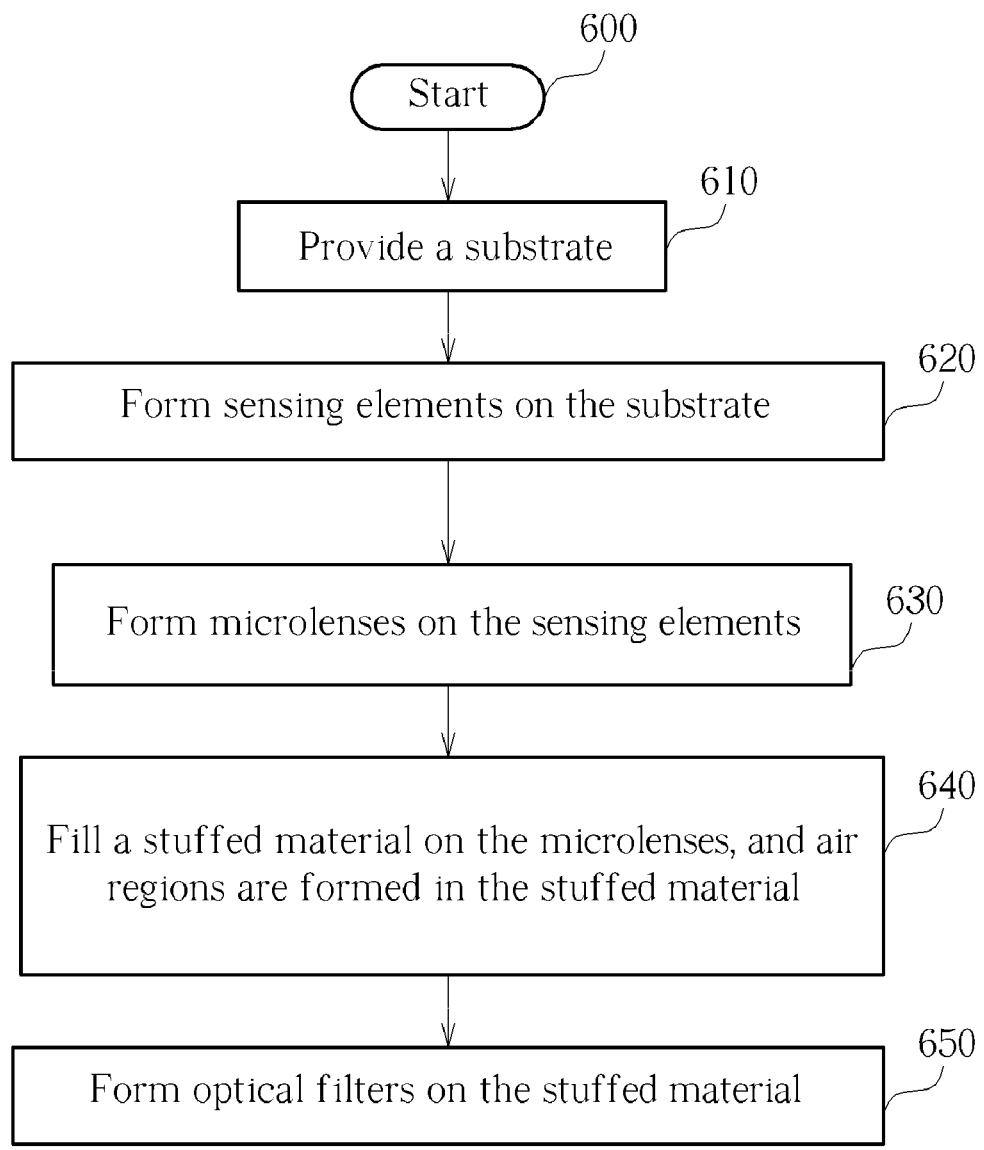
FIG. 6 is a flowchart illustrating a fabricating method of an image sensor according to an exemplary embodiment of the present invention.

Please refer to FIG. 6. FIG. 6 is a flowchart illustrating a fabricating method of an image sensor according to an exemplary embodiment of the present invention. Please note that the following steps are not limited to be performed according to the exact sequence shown in FIG. 6 if a roughly identical result can be obtained. The exemplary fabricating method includes, but is not limited to, the following steps:

Step 600: Start.
Step 610: Provide a substrate.
Step 620: Form sensing elements on the substrate.
Step 630: Form microlenses on the sensing elements.
Step 640: Fill a stuffed material on the microlenses, and air regions are formed in the stuffed material.
Step 650: Form optical filters on the stuffed material.

How each element operates can be known by collocating the steps shown in FIG. 6 and the elements shown in FIG. 2 (or FIG. 3 or FIG. 5), and further description is omitted here for brevity. Please note that, the steps of the abovementioned flowchart are merely a practicable embodiment of the present invention, and in no way should be considered to be limitations of the scope of the present invention. The method can include other intermediate steps or several steps can be merged into a single step without departing from the spirit of the present invention.

The abovementioned embodiments are presented merely for describing features of the present invention, and in no way should be considered to be limitations of the scope of the present invention. Certainly, people skilled in the art will readily appreciate that other designs for implementing the image sensor are feasible.

In summary, the exemplary embodiment of the present invention provides an image sensor and a related fabricating method of an image sensor. By disposing the microlens between the substrate and the optical filter, the optical path of the filtered incident light reaching the pixel region can be shortened. Therefore, the quantum efficiency can be improved due to a better light transmission efficiency provided by the proposed architecture employed by the image sensor. What calls for special attention is that the stuffed material is filled on the microlenses, that is to say, the stuffed material is filled in between the optical filter and the microlens, wherein at least one air region is formed in the stuffed material. In this way, the air region formed in the stuffed material can provide the filtered incident light with a better refraction path. In addition, a shelter may be placed around the microlens so as to reduce cross-talk of the image sensor, or the stuffed material may be further filled in between the optical filter and the shelter so as to further improve the performance of the image sensor.

Those skilled in the art will readily observe that numerous modifications and alterations of the device and method may be made while retaining the teachings of the invention.

What is claimed is:

1. A fabricating method of an image sensor, comprising:
   providing a substrate;
   forming sensing elements on the substrate;
   forming microlenses on the sensing elements;
   filling a stuffed material on the microlenses, and air regions are formed in the stuffed material;
   placing shelters around the microlenses, wherein each of the shelters is made of a metal material; and
   forming optical filters on the stuffed material.

2. The fabricating method of claim 1, wherein the step of filling the stuffed material comprises:
   utilizing a chemical vapor deposition process to fill the stuffed material on the microlenses.

3. The fabricating method of claim 1, wherein the step of filling the stuffed material further comprises:
   filling the stuffed material in between the optical filters and the shelters.

4. The fabricating method of claim 1, wherein a height of the shelter is not less than a height of the microlens.

5. The fabricating method of claim 1, wherein the image sensor employs a back side illumination (BSI) technology.

6. The fabricating method of claim 1, wherein the image sensor is a Complementary Metal Oxide semiconductor (CMOS) sensor.

7. An image sensor comprising:
   a substrate;
   a sensing element on the substrate;
   a microlens on the sensing element;
   a stuffed material, filled on the microlens, wherein at least one air region is formed in the stuffed material;
   a shelter, placed around the microlens, wherein the shelter is made of a metal material; and
   an optical filter, being formed on the stuffed material.

8. The image sensor of claim 7, wherein the stuffed material is further filled in between the optical filter and the shelter.

9. The image sensor of claim 7, wherein a height of the shelter is not less than a height of the microlens.

10. The image sensor of claim 7, wherein the image sensor employs a back side illumination (BSI) technology.

11. The image sensor of claim 7, wherein the image sensor is a Complementary Metal Oxide semiconductor (CMOS) sensor.

12. The image sensor of claim 7, wherein the stuffed material is formed as a planar layer, for the optical filter to be formed thereon.

* * * * *